United States Patent
Khlat et al.

(10) Patent No.: US 8,644,198 B2
(45) Date of Patent: Feb. 4, 2014

(54) SPLIT-BAND POWER AMPLIFIERS AND DUPLEXERS FOR LTE-ADVANCED FRONT END FOR IMPROVED IMD

(75) Inventors: Nadim Khlat, Midi-Pyrenees (FR); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 243 days.

(21) Appl. No.: 13/045,621

(22) Filed: Mar. 11, 2011

(65) Prior Publication Data

US 2011/0222444 A1 Sep. 15, 2011

Related U.S. Application Data

(60) Provisional application No. 61/313,392, filed on Mar. 12, 2010.

(51) Int. Cl.
*H04B 7/00* (2006.01)
(52) U.S. Cl.
USPC ............ 370/277; 370/279; 370/293; 370/296
(58) Field of Classification Search
USPC ........... 370/277, 281, 235; 455/11.1, 75, 323; 307/115
See application file for complete search history.

(56) References Cited

U.S. PATENT DOCUMENTS

| | | | |
|---|---|---|---|
| 2006/0003797 A1* | 1/2006 | Ogawa | 455/550.1 |
| 2009/0180403 A1 | 7/2009 | Tudosoiu | |
| 2010/0099366 A1* | 4/2010 | Sugar et al. | 455/75 |
| 2011/0241787 A1 | 10/2011 | Mastovich | |
| 2012/0235735 A1* | 9/2012 | Spits et al. | 330/126 |
| 2012/0320803 A1 | 12/2012 | Skarp | |

OTHER PUBLICATIONS

Notice of Allowance for U.S. Appl. No. 13/045,604, mailed May 17, 2013, 11 pages.

* cited by examiner

*Primary Examiner* — Andrew Lai
*Assistant Examiner* — Jamaal Henson
(74) *Attorney, Agent, or Firm* — Withrow & Terranova, P.L.L.C.

(57) ABSTRACT

A front end radio architecture (FERA) is disclosed that includes a transmitter block coupled to a power amplifier (PA) via first and second input terminals. A first split-band duplexer is coupled to a first output terminal of the PA and a second split-band duplexer is coupled to a second output terminal of the PA. The PA includes a first amplifier cell and a second amplifier cell that when coupled to the first and second split-band duplexers makes up first and second transmitter chains. Only one of the first and the second transmitter chains is active when a first carrier and a second carrier have a frequency offset that is less than an associated half duplex frequency within a same split-band duplex band, thus preventing third order inter-modulation (IMD) products from falling within an associated receive channel. Otherwise, the first and the second transmitter chains are both active.

15 Claims, 8 Drawing Sheets

SPLIT-BAND POWER AMPLIFIERS AND DUPLEXERS FOR LTE-ADVANCED FRONT END FOR IMPROVED IMD

RELATED APPLICATIONS

This application claims the benefit of provisional patent application No. 61/313,392, filed Mar. 12, 2010, the disclosure of which is hereby incorporated herein by reference in its entirety. This application is related to U.S. Pat. No. 8,537,723 entitled LTE-ADVANCED (4G) FRONT END RADIO ARCHITECTURE, the disclosure of which is incorporated herein by reference in its entirety.

FIELD OF THE DISCLOSURE

The present disclosure relates to front end radio architectures (FERAs) directed towards long term evolution advanced (LTE-Advanced) user equipment (UE).

BACKGROUND

A long term evolution advanced (LTE-Advanced) network standard has been developed to provide wireless data rates of 1 Gbps downlink and 500 Mbps uplink. The LTE-Advanced network standard also offers multi-carrier transmission and reception within a single band as well as multi-carrier transmission and reception within two separate bands. Multi-carrier transmission within a single band is referred to as intra-band transmission and reception. In contrast, multi-carrier transmission and reception within two different bands is referred to as inter-band transmission and reception. LTE-Advanced technology is also known as fourth generation (4G) technology.

Major challenges are associated with realizing front end radio architectures (FERAs) that are necessary for providing multi-carrier operation using intra-band and inter-band transmission and reception. One of the major challenges pertains to transmit (TX) multi-carrier inter-modulation (IMD) products that can fall within a multi-carrier receive (RX) channel. Another major challenge pertains to RX de-sense due to the proximity of a multi-carrier TX channel. This major challenge is exacerbated by multi-carrier operation in which an offset frequency between the TX channel and the RX channel can be lower than a typical duplex frequency offset. Therefore, a need exists for a FERA having improved IMD performance.

SUMMARY

The present disclosure provides a front end radio architecture (FERA) having improved inter-modulation (IMD) performance through the use of split-band power amplifiers (PAs) and split-band duplexers. In general, the FERA of the present disclosure allows operation in long term evolution advanced (LTE-Advanced) modes such as an intra-band contiguous and a non-contiguous component carrier (CC) aggregation mode as well as an inter-band non-contiguous CC aggregation mode. In particular, the FERA of the present disclosure includes a transmitter block coupled to a PA via a first input terminal and a second input terminal. A first split-band duplexer is coupled to a first output terminal of the PA and a second split-band duplexer is coupled to a second output terminal of the PA. The PA includes a first amplifier cell and a second amplifier cell that when coupled to the first and second split-band duplexers makes up first and second transmitter chains. However, the first amplifier cell and the second amplifier cell of the PA could be replaced by a first full PA and a second full PA without deviating from the teachings of the present disclosure. Moreover, the first amplifier cell and the second amplifier cell of the PA could also be replaced by a first half amplifier cell and a second half amplifier cell without deviating from the teachings of the present disclosure.

User equipment (UE) in the form of a mobile terminal incorporates a preferred embodiment of the FERA of the present disclosure. The disclosed mobile terminal includes a baseband processor and a control system for controlling the disclosed FERA. The control system outputs control signals that activate and deactivate the first transmitter chain and the second transmitter chain.

The present disclosure also provides a method that is executable by the control system to determine the status of a frequency offset between a first carrier and a second carrier. If a determination indicates that the frequency offset of the first carrier and the second carrier is greater than or equal to an associated half duplex frequency, the first carrier will be transmitted via the first transmitter chain, while the second carrier will be transmitted by the second transmitter chain. However, if a determination indicates that the frequency offset is less than the associated half duplex frequency while also being within a same split-band duplex frequency range, then only one of the first or the second transmitter chains is active, thus preventing third order IMD products from falling within an associated receive (RX) channel.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure addresses two major challenges that require solutions in multi-carrier transmission for cellular systems. A first challenge involves the generation of intermodulation (IMD) products that can fall in one of a plurality of multi-carrier receive (RX) channels. A second challenge pertains to RX de-sense due to the proximity of a multi-carrier transmit (TX) channel to a multi-carrier RX channel. This second challenge arises from multi-carrier operation in which an offset frequency between TX frequencies and RX frequencies can be lower than a traditional duplex frequency offset.

Figure 1:
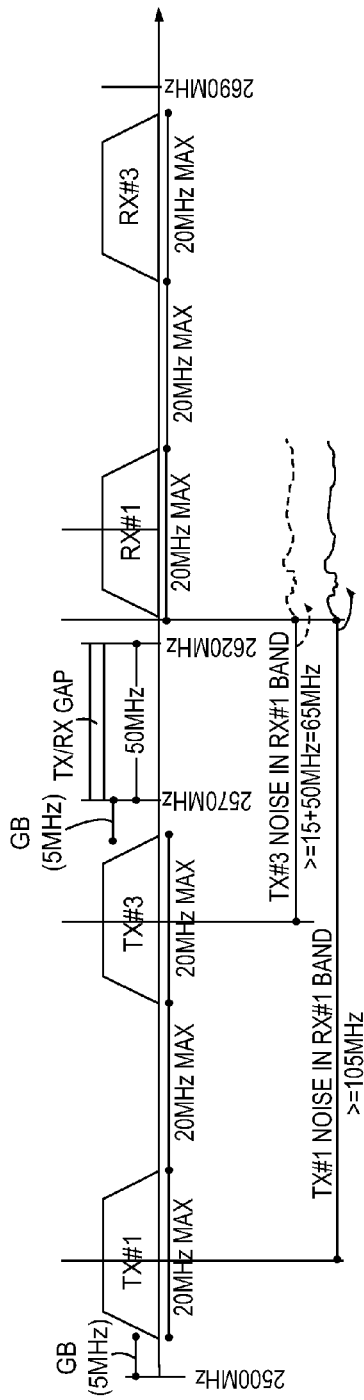
FIG. 1 is a multi-carrier spectrum diagram that illustrates a level of de-sense within a receive (RX) band due to the presence of more than one transmit carrier frequency in the same band.

FIG. 1 is a multi-carrier spectrum diagram that illustrates a level of RX de-sense within an RX band due to the presence of more than one TX carrier frequency in the same band. Due to the presence of more than one TX carrier frequency in the same band, the level of RX de-sense within the RX band can increase significantly for frequency division duplex (FDD) systems. A poor downlink data rate is a likely result of the significantly increased level of RX de-sense. While there are several RX de-sense mechanisms in FDD systems, the focus of the present disclosure is an extra degradation that results from multi-carrier operation.

In particular, FIG. 1 presents the spectrum for LTE-Advanced Band 7 wherein multi-carrier operation is considered for LTE-Advanced networks. As an example, assume that two TX carriers are used and that each of the two TX carriers uses a full 20 MHz of channel allocation. As a result, an RX channel RX#1 sees two TX noise sources that fall within the bandwidth of the RX channel RX#1 instead of a single TX noise source. Moreover, the RX channel RX#1 will see a new TX noise source that has a frequency offset that is much lower than the typical duplex frequency offset. As shown in FIG. 1, the noise generated from the TX channel TX#3 that falls within the RX channel RX#1 has an offset frequency of 65 MHz from the center of the TX channel TX#3 to the starting frequency of the RX channel RX#1.

Figure 2:
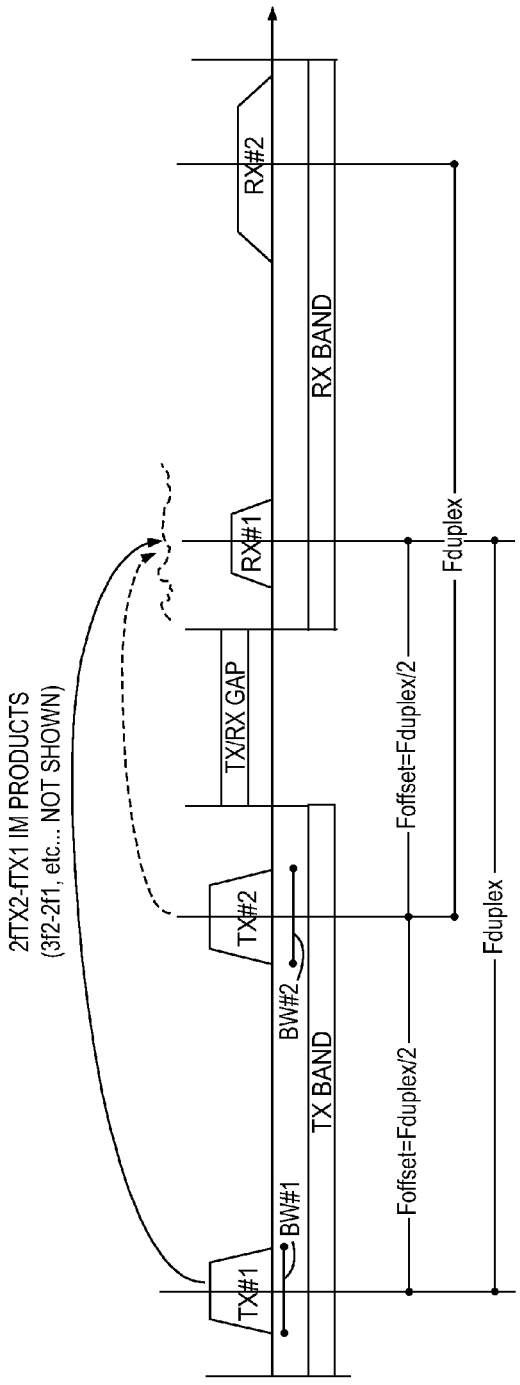
FIG. 2 is a multi-carrier spectrum diagram that illustrates a source of RX de-sense that is attributable to inter-modulation (IMD) products of transmit (TX) multi-carriers due to non-linearities.

FIG. 2 is a multi-carrier spectrum diagram that illustrates a source of RX de-sense that is attributable to IMD products of TX multi-carriers due to nonlinearities. In particular, RX de-sense is further complicated due to the presence of two relatively large TX multi-carrier signals that have a power of around +20 dBm each, as opposed to a traditional single-carrier TX signal having a power of around +20 dBm that mixes with a −15 dBm RX blocker, which is common in present LTE-Advanced systems. For example, FIG. 2 shows a third order IMD product that falls inside the RX channel RX#1 when two TX multi-carrier signals are spaced by a frequency offset that is half the duplex frequency. Further still, higher order IMD products such as 3f2-2f1 can fall within the RX channel RX#1.

Figure 3:
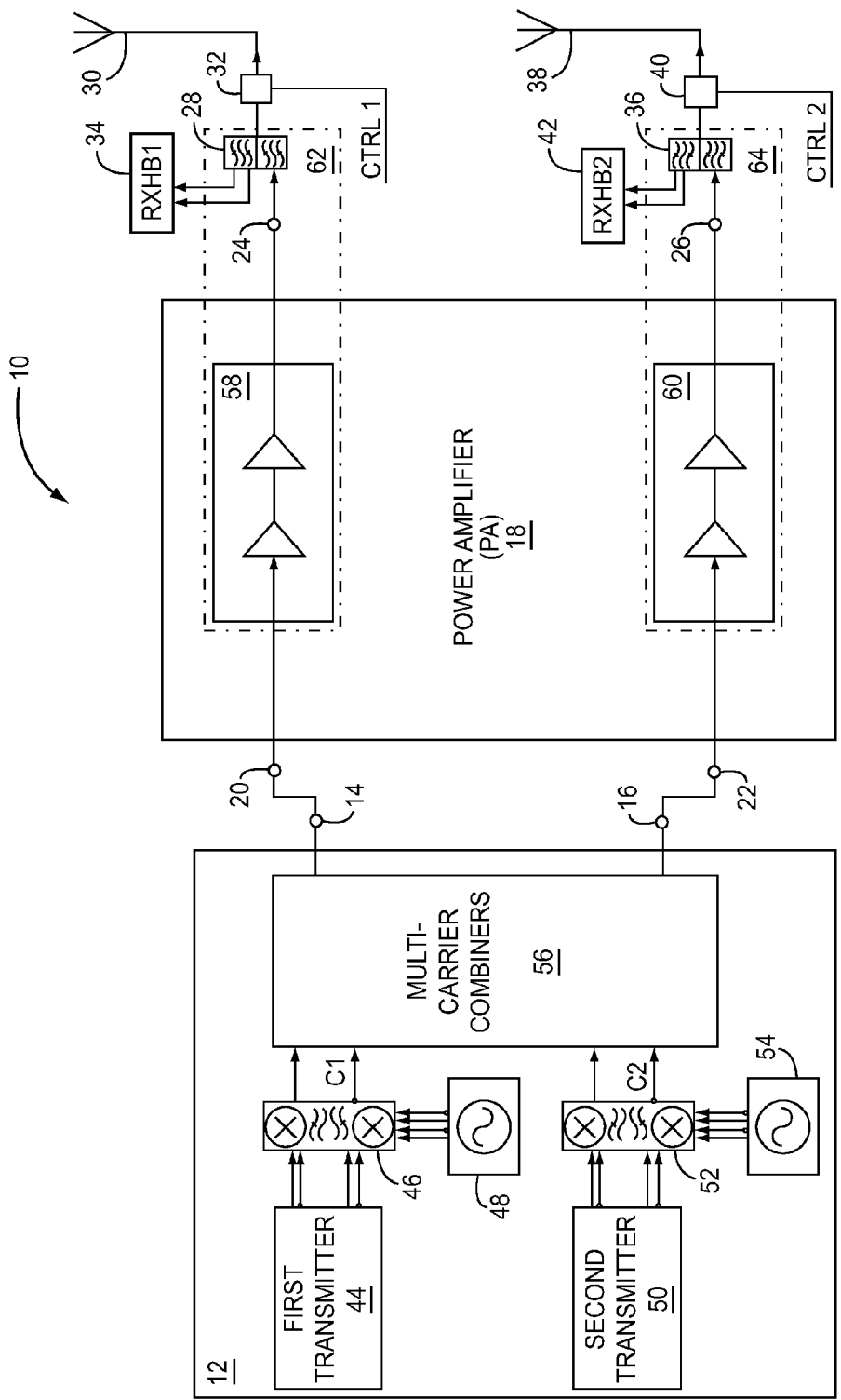
FIG. 3 depicts a front end radio architecture (FERA) that in accordance with the present disclosure includes a power amplifier (PA) that drives split-band duplexers for reducing RX de-sense due to the presence of more than one TX carrier frequency in the same band and IMD products.

FIG. 3 depicts a front end radio architecture (FERA) 10 that in accordance with the present disclosure addresses these two major problems. First, the FERA 10 provides a reduction of nonlinearity IMD products from TX multi-carriers that can fall within multi-carrier RX channels such as RX channel RX#1 (FIGS. 1 and 2). Second, the FERA 10 addresses the problem of RX de-sense due to the proximity of one multi-carrier TX channel that is lower than a typical duplex offset. Further still, the FERA 10 is suitable for LTE-Advanced operation modes such as an intra-band contiguous and a non-contiguous component carrier (CC) aggregation mode as well as an inter-band non-contiguous CC aggregation mode. For example, the FERA 10 allows a simultaneous TX operation in the inter-band non-contiguous CC aggregation mode by having simultaneous transmission in two different bands, such as a band A and a band B. Moreover, the FERA 10 of the present disclosure allows operation in compliance with the Evolved UMTS Terrestrial Radio Access (E-UTRA) release 8 specifications, and the Advanced E-UTRA release 9/10 specification, without adding the complexity of high linearity components, while also enabling more options for spectrum aggregation to wireless operators.

In general, the FERA 10 includes a transmitter block 12 for transmitting LTE Advanced multi-carrier signals. The transmitter block 12 includes a first output terminal 14 for outputting band A signals, and a second output terminal 16 for outputting band B signals. The FERA 10 also includes a power amplifier (PA) 18 having a first input terminal 20, a second input terminal 22, a first output terminal 24, and a second output terminal 26. The first output terminal 14 of the transmitter block 12 is coupled to the first input terminal 20 of the PA 18, and the second output terminal 16 of the transmitter block 12 is coupled to the second input terminal 22 of the PA 18.

A first split-band duplexer 28 is coupled to the first output terminal 24 of the PA 18. The first split-band duplexer 28 is also coupled to a first antenna 30 through a first band switch 32 that is responsive to a control signal CTRL1. The first split-band duplexer 28 outputs signals captured by the first antenna 30 to a first high band receiver (RXHB1) 34.

A second split-band duplexer 36 is coupled to the second output terminal 26 of the PA 18. The second split-band duplexer 36 is also coupled to a second antenna 38 through a second band switch 40 that is responsive to a control signal CTRL2. The second split-band duplexer 36 outputs signals captured by the second antenna 38 to a second high band receiver (RXHB2) 42.

The transmitter block 12 includes a first transmitter 44; a first radio frequency (RF) modulator 46; and a first RF phase locked loop (PLL) 48. The transmitter block 12 also includes a second transmitter 50; a second RF modulator 52; and a second RF PLL 54. The transmitter block 12 further includes multi-carrier combiners 56, which are usable to combine a first carrier C1 output from the first RF modulator 46 with a second carrier C2 output from the second RF modulator 52.

The PA 18 includes a first amplifier cell 58 coupled between the first input terminal 20 and the first output terminal 24. The PA 18 also includes a second amplifier cell 60 coupled between the second input terminal 22 and the second output terminal 26. A first transmitter chain 62 comprises the first amplifier cell 58 and the first split-band duplexer 28. A second transmitter chain 64 comprises the second amplifier cell 60 and the second split-band duplexer 36.

In operation, the first transmitter 44 outputs analog baseband (ABB) signals to the first RF modulator 46. Similarly, the second transmitter 50 outputs ABB signals to the second RF modulator 52. In response, the first RF modulator 46 in cooperation with the first RF PLL 48 outputs the first carrier C1 within the band A, while the second RF modulator 52 in cooperation with the second RF PLL 54 outputs the second carrier C2 within the band B. The first carrier C1 is fed from the first RF modulator 46 into the multi-carrier combiners 56. Simultaneously, the second carrier C2 is fed from the second RF modulator 52 into the multi-carrier combiners 56, where the first carrier C1 and the second carrier C2 are combined into a dual carrier composite signal C1+C2 that can be processed by a multiplexing transformer topology (not shown) to provide the dual carrier composite signal C1+C2 or the first carrier C1 or the second carrier C2 as output from the multi-carrier combiners 56.

When the first carrier C1 and the second carrier C2 have an offset frequency equal to or greater than the half duplex frequency, then the first carrier C1 is transmitted via the first transmitter chain 62, and the second carrier C2 is transmitted via the second transmitter chain 64. As a result, the first carrier C1 is transmitted from the first antenna 30, while the second carrier C2 is transmitted from the second antenna 38.

IMD products that are generated before arriving at a typical duplexer configuration (not shown) can result in an increased level of noise in an RX band channel such as the RX channel RX#1 (FIGS. 1 and 2). IMD products such as these can be generated by a PA such as the PA 18. Other IMD products can be generated within band switches such as the first band switch 32 and the second band switch 40. In traditional FERAs, these other IMD products, also known as reverse IMD products, can fall unfiltered within an RX channel such as the RX channel RX#1. Therefore, these reverse IMD products must be at a power level that is below a sensitivity noise floor in order not to cause a receiver de-sense level. Thus, traditional FERAs have IMD component requirements that are much higher as a result of multi-carrier transmission. For example, IMD levels for traditional FERAs need to be below −110 dBm for two or more modulated carriers such as the first carrier C1 and the second carrier C2, each of which has a power level of +20 dBm.

Fortunately, if the first carrier C1 and the second carrier C2 are susceptible to generate IMD products, the configuration of the first split-band duplexer 28 and the second split-band duplexer 36 will not allow the IMD products to appear directly within either the first band switch 32 or the second band switch 40. This is because the first carrier C1 and the second carrier C2 will arrive at the first split-band duplexer 28 and the second split-band duplexer 36 before arriving at either the first band switch 32 or the second band switch 40. Thus, the first carrier C1 and the second carrier C2 cannot generate IMD products that can fall with an RX band of interest. However, reverse IMD products having significantly less power than the IMD products discussed above can be generated. For example, the second carrier C2 transmitted from the second antenna 38 can leak into the first antenna 30 and generate reverse IMD products at the first band switch 32. Fortunately, antenna isolation between the first antenna 30 and the second antenna 38 is around 10 dB, which significantly reduces the power level of any reverse IMD products generated. As a result of the antenna isolation, linearity requirements for the first band switch 32 and the second band switch 40 are significantly reduced. Therefore, a significant cost savings can be realized through the use of the FERA 10.

Figure 4:
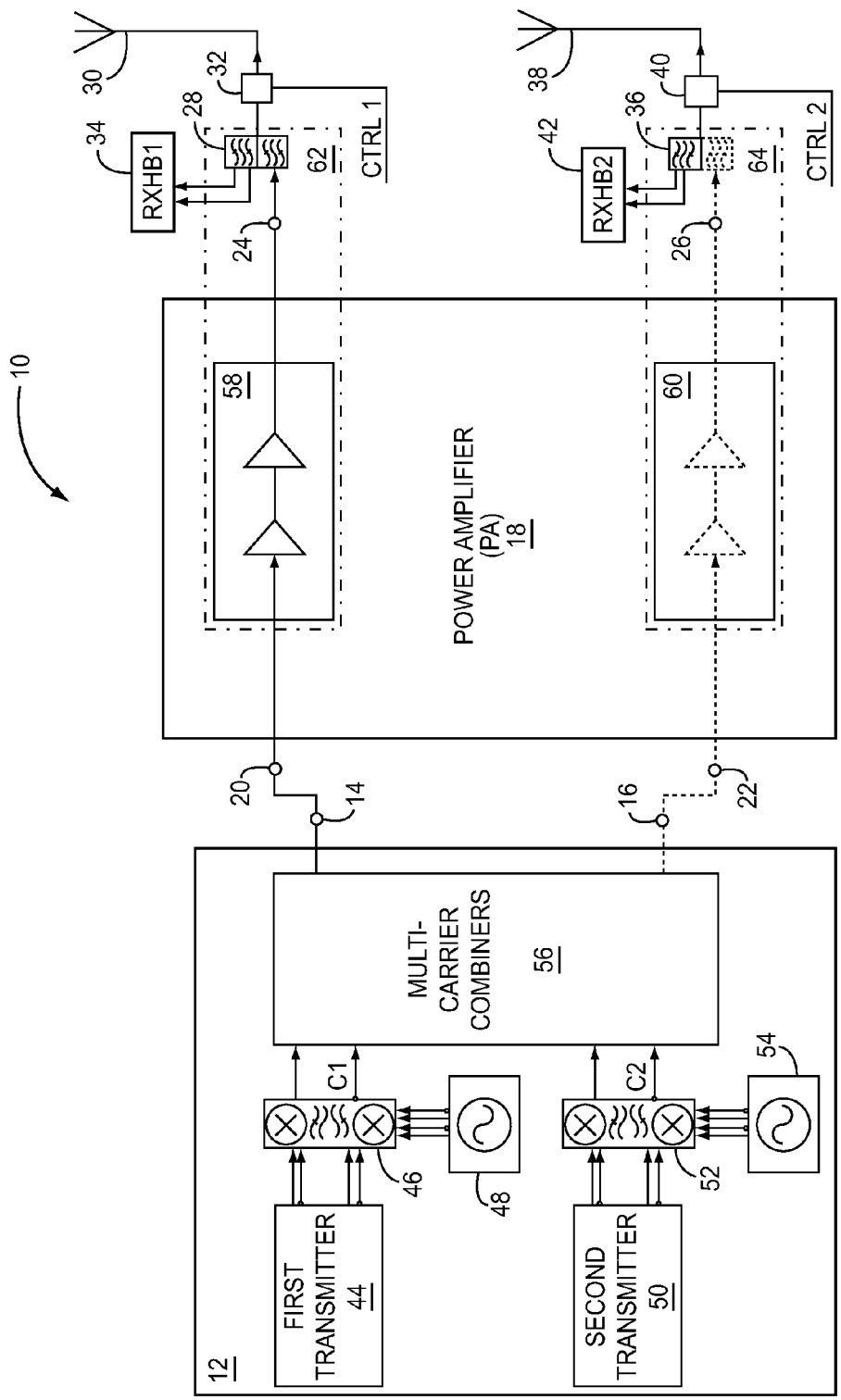
FIG. 4 depicts the FERA of FIG. 3, wherein only one split-band transmitter chain is activated.

FIG. 4 depicts the FERA 10 in operation when the carrier C1 and the carrier C2 have an offset that is less than the half duplex frequency (i.e., 2*f2−f1<f1+duplex) and are within the same split-band duplexer frequency. In this case, only one of the first transmitter chain 62 or the second transmitter chain 64 is active. The other transmitter chain, either the first transmitter chain 62 or the second transmitter chain 64, is deactivated, since third order IMD products do not fall within an RX channel such as RX channel RX#1. FIG. 4 depicts activation of the first transmitter chain 62 only. As shown using a dashed line, the second transmitter chain 64 is deactivated. However, even though the second amplifier cell 60 is off due to the second transmitter chain 64 being deactivated, the second split-band duplexer 36 is still usable to monitor RX channels that are located within the particular split-band frequency range of operation.

Figure 5:
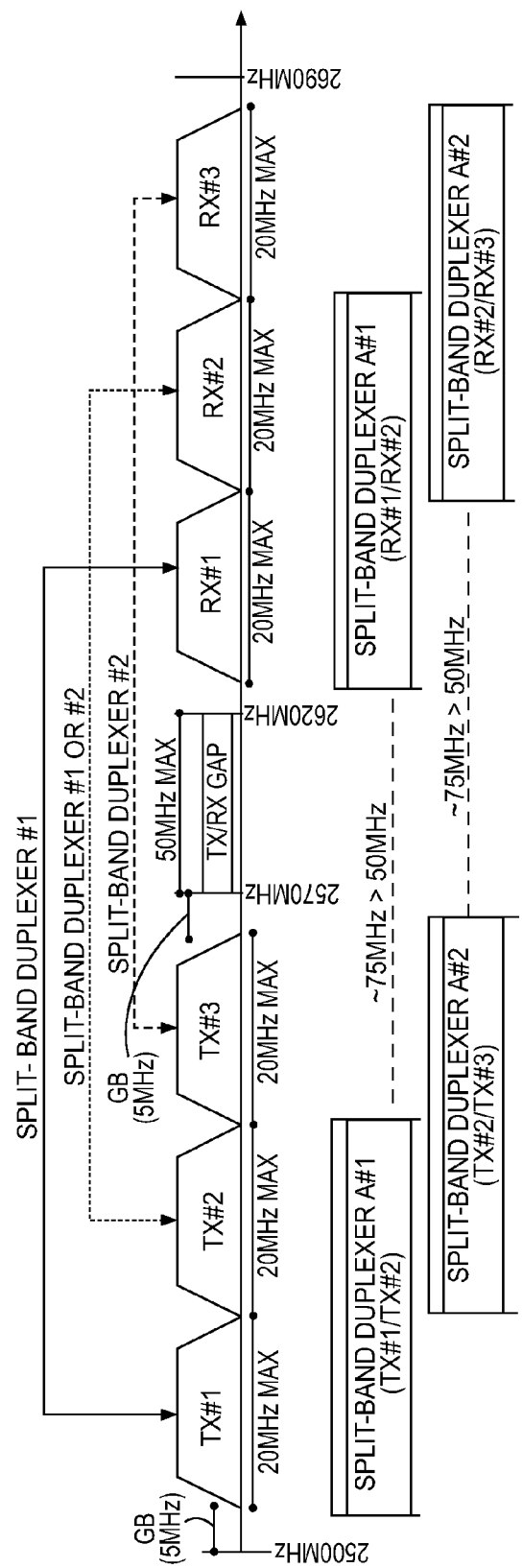
FIG. 5 is a spectrum diagram that illustrates that a first split-band duplexer and a second split-band duplexer can experience a frequency overlap that results from an inability to divide an associated TX band in half or allow additional channel allocation.

FIG. 5 is a spectrum diagram that illustrates that the first split-band duplexer 28 (FIGS. 3 and 4) and the second split-band duplexer 36 (FIGS. 3 and 4) can experience a frequency overlap that results from an inability to divide an associated TX band in half or allow additional channel allocation. For example, some TX bands such as the LTE-Advanced band 7 do not allow a simple half split. Therefore, an overlap of 20 MHz is considered for the first split-band duplexer 28 and the second split-band duplexer 36. The 20 MHz overlap makes a large multi-carrier bandwidth available for the operation of the FERA 10.

For instance, if the first carrier C1 is within the TX channel TX#1 and the second carrier C2 is within the TX channel TX#3, the first carrier C1 is output from the first output terminal 24 of the PA 18 (FIGS. 3 and 4), and the second carrier C2 is output from the second output terminal 26 of the PA 18. However, if the first carrier C1 is within the TX channel TX#1 and the second carrier C2 is within the TX channel TX#2, the first carrier C1 is output from the first output terminal 24 of the PA 18, and the second carrier C2 is output from the second output terminal 26 of the PA 18 to reduce any adverse effects due to IMD products.

Higher TX and TX gap frequencies of about 75 MHz for LTE-Advanced band 7 are associated with the use of the first split-band duplexer 28 and the second split-band duplexer 36 in comparison with a typical single-band duplexer (not shown) that is associated with TX and RX gap frequencies of about 50 MHz for the LTE-Advanced band 7. This additional 25 MHz TX and RX gap associated with the use of the first split-band duplexer 28 and the second split-band duplexer 36 provides improved noise filtering in the RX channel RX#1 and the RX channel RX#2.

Figure 6:
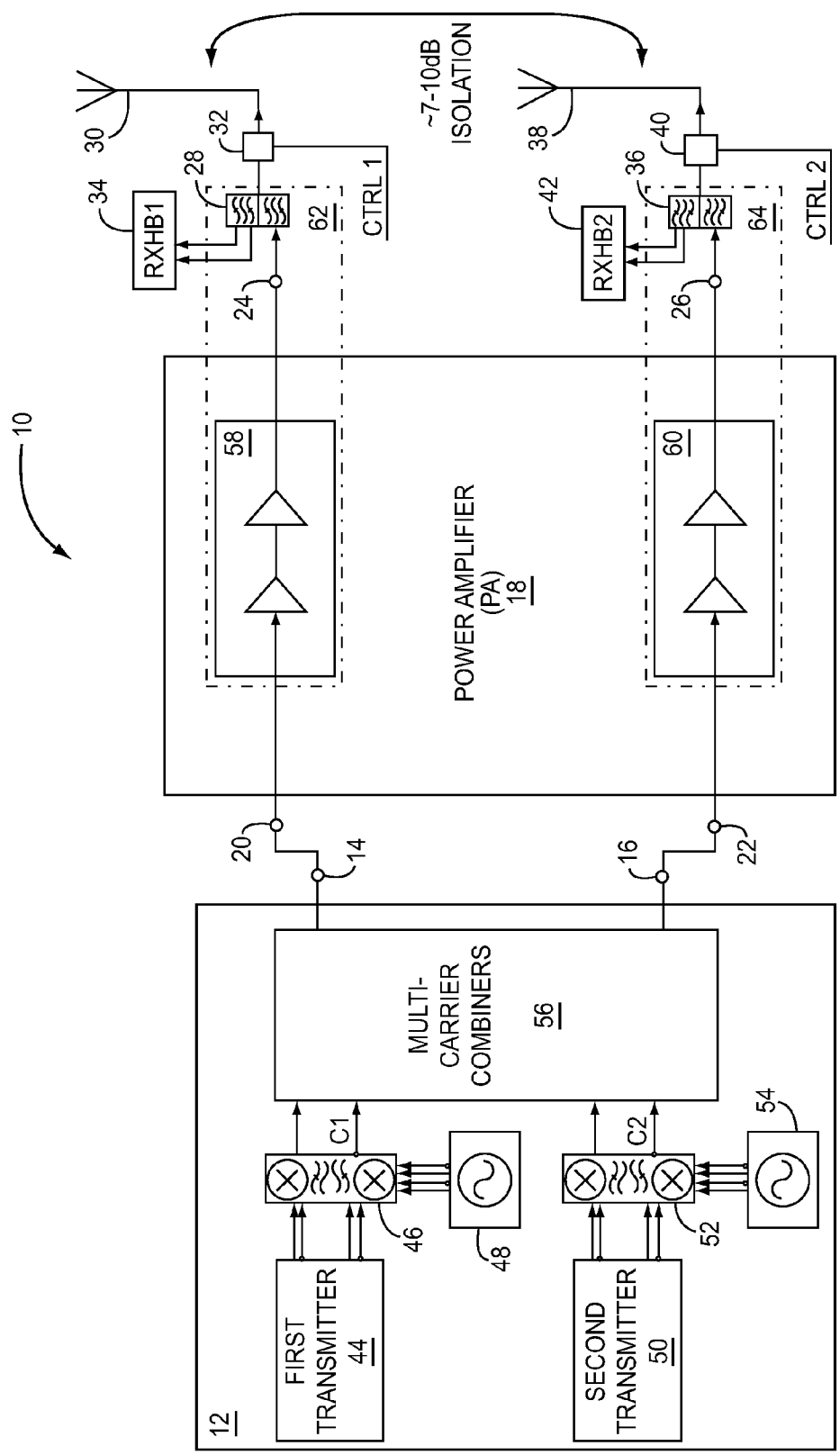
FIG. 6 depicts the antenna isolation between a first antenna and a second antenna for the FERA of FIG. 3.

FIG. 6 depicts the FERA 10 (FIGS. 3 and 4) and illustrates that the residual noise falling within the RX channel RX#1 and the RX channel RX#2 is further reduced by decreasing antenna coupling between the first antenna 30 and the second antenna 38. The antenna isolation that may be provided by reducing antenna coupling is typically in the range of 7-10 dB.

Figure 7:
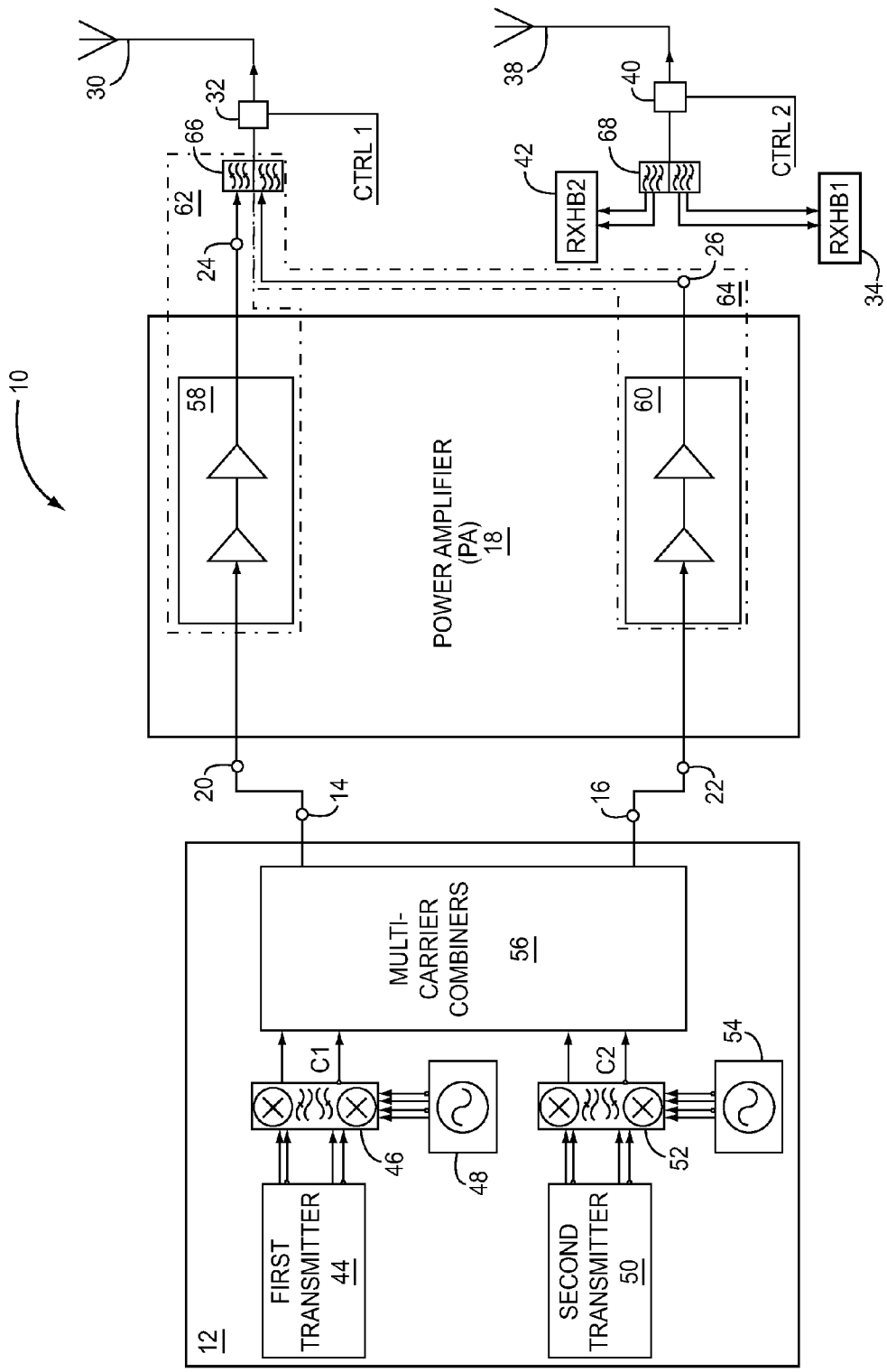
FIG. 7 depicts modifications to the FERA of FIG. 3, wherein antenna isolation between the first antenna and the second antenna is increased by splitting duplexers into separate TX and RX filters.

FIG. 7 depicts modifications to the FERA 10 (FIGS. 3, 4, and 6) wherein antenna isolation between the first antenna 30 and the second antenna 38 is increased by splitting each duplexer such as the first split-band duplexer 28 and the second split-band duplexer 36 (FIGS. 3, 4, and 6) into separate TX and RX filters. In the case of FIG. 7, a first modification couples a TX split-band duplexer 66 between the first output terminal 24 and the first band switch 32, thereby replacing the first split-band duplexer 28 (FIGS. 3, 4, and 6). A second modification couples an RX split-band duplexer 68 between the second output terminal 26 and the second band switch 40. The TX split-band duplexer 66 comprises only TX filters and the RX split-band duplexer 68 comprises only RX filters. In this way, improved antenna isolation between the first antenna 30 and the second antenna 38 is realized, while a duplexing function is also provided. A relatively large variation of TX/RX isolation over a relatively large voltage standing wave ratio (VSWR) requires an adaptive tuning of relatively large IMD products since the first carrier C1 and the second carrier C2 appear at the first band switch 32.

Figure 8:
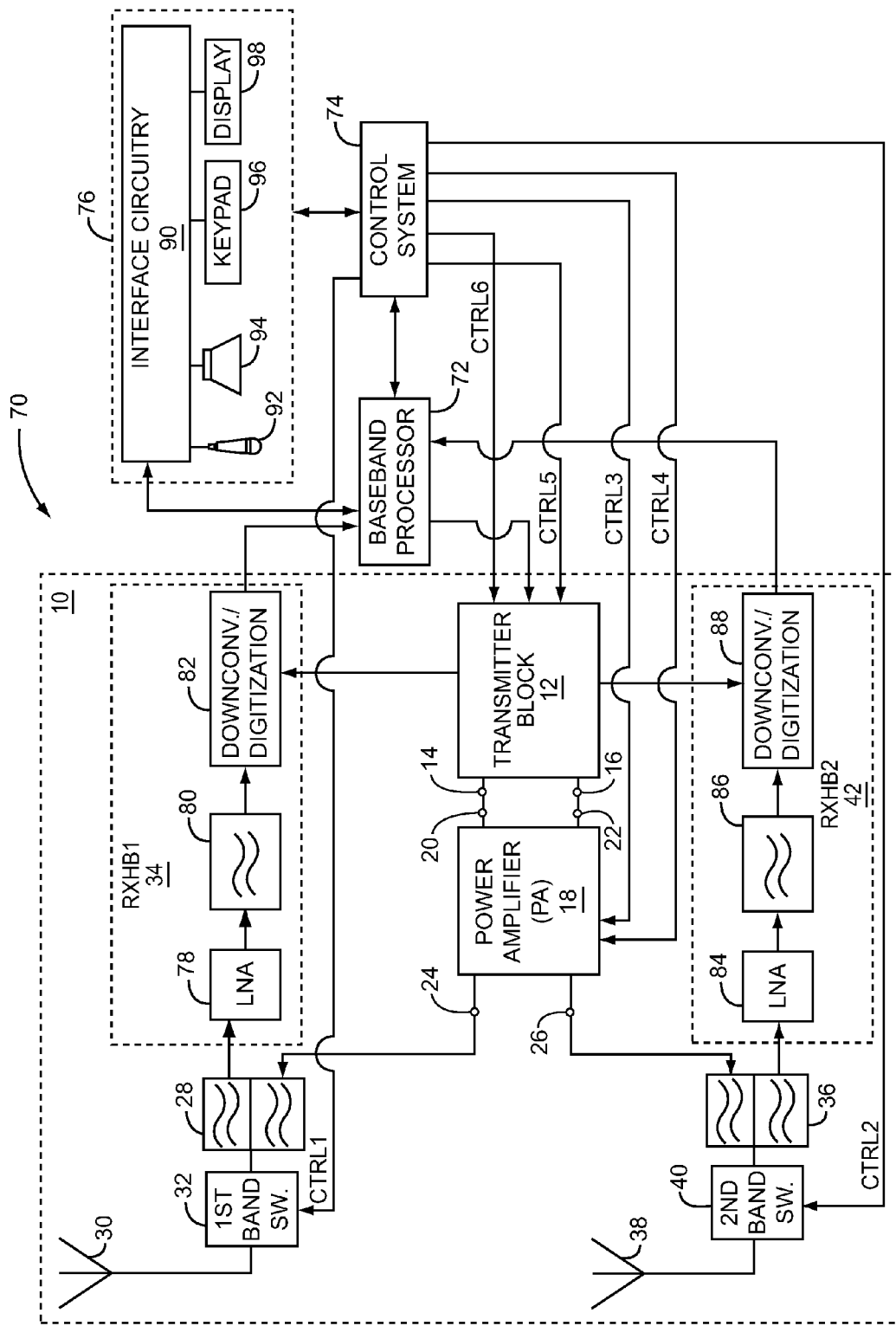
FIG. 8 depicts user equipment (UE) in the form of a mobile terminal that incorporates a preferred embodiment of the FERA of the present disclosure.

FIG. 8 depicts user equipment (UE) in the form of a mobile terminal 70 that incorporates a preferred embodiment of the FERA 10 of the present disclosure. The mobile terminal 70 may be, but is not limited to, a mobile telephone, a personal digital assistant (PDA), or the like. The basic architecture of the mobile terminal 70 may also include a baseband processor 72, a control system 74, and an interface 76. The first antenna 30 receives information-bearing RF signals from one or more remote transmitters provided by a base station (not shown). The first band switch 32 under the control of the CTRL1 signal output from the control system 74 allows the information-bearing RF signals to feed through the first split-band duplexer 28 and into the RXHB1 34. The RXHB1 34 includes a low noise amplifier (LNA) 78 that amplifies the signal, and a filter circuit 80 that minimizes broadband interference in the received signals. The RXHB1 34 also includes downconversion and digitization circuitry 82, which downconverts the filtered, received signals to intermediate or baseband frequency signals, which are then digitized into one or more digital streams.

Similarly, the second antenna 38 receives information-bearing RF signals from one or more remote transmitters provided by a base station (not shown). The second band switch 40 under the control of the CTRL2 signal output from the control system 74 allows the information-bearing RF signals to feed through the second split-band duplexer 36 and into the RXHB2 42. The RXHB2 42 includes a LNA 84 that amplifies the signals, and a filter circuit 86 that minimizes broadband interference in the received signals. The RXHB2 42 also includes downconversion and digitization circuitry 88, which downconverts the filtered, received signals to intermediate or baseband frequency signals, which are then digitized into one or more digital streams.

The baseband processor 72 processes the digitized received signals to extract the information or data bits conveyed in the received signals. This processing typically comprises demodulation, decoding, and error correction operations. As such, the baseband processor 72 is generally implemented in one or more digital signal processors (DSPs).

On the TX side, the baseband processor 72 receives digitized data, which may represent voice, data, or control information, which it encodes for transmission, from the control system 74. The encoded data is output to the transmitter block 12 to modulate the first carrier C1 and the second carrier C2. As previously described, the first carrier C1 and the second carrier C2 may be in the same band, or they may be in separate bands. The PA 18 amplifies the first carrier C1 to a level appropriate for transmission from the first antenna 30, while the PA 18 amplifies the second carrier C2 to a level appropriate for transmission from the second antenna 38. Different combinations of the first carrier C1 and the second carrier C2 including the dual composite signal C1+C2 may also be transmitted from either the first antenna 30 or the second antenna 38 under control of the control signals CTRL1 through CTRL6.

A user may interact with the mobile terminal 70 via the interface 76, which may include interface circuitry 90 associated with a microphone 92, a speaker 94, a keypad 96, and a display 98. The interface circuitry 90 typically includes analog-to-digital converters, digital-to-analog converters, amplifiers, and the like. Additionally, it may include a voice encoder/decoder, in which case it may communicate directly with the baseband processor 72.

The microphone 92 will typically convert audio input, such as the user's voice, into an electrical signal, which is then digitized and passed directly or indirectly to the baseband processor 72. Audio information encoded in the received signal is recovered by the baseband processor 72 and converted by the interface circuitry 90 into an analog signal suitable for driving the speaker 94. The keypad 96 and the display 98 enable the user to interact with the mobile terminal 70, inputting numbers to be dialed, address book information, or the like, as well as monitoring call progress information.

Figure 9:
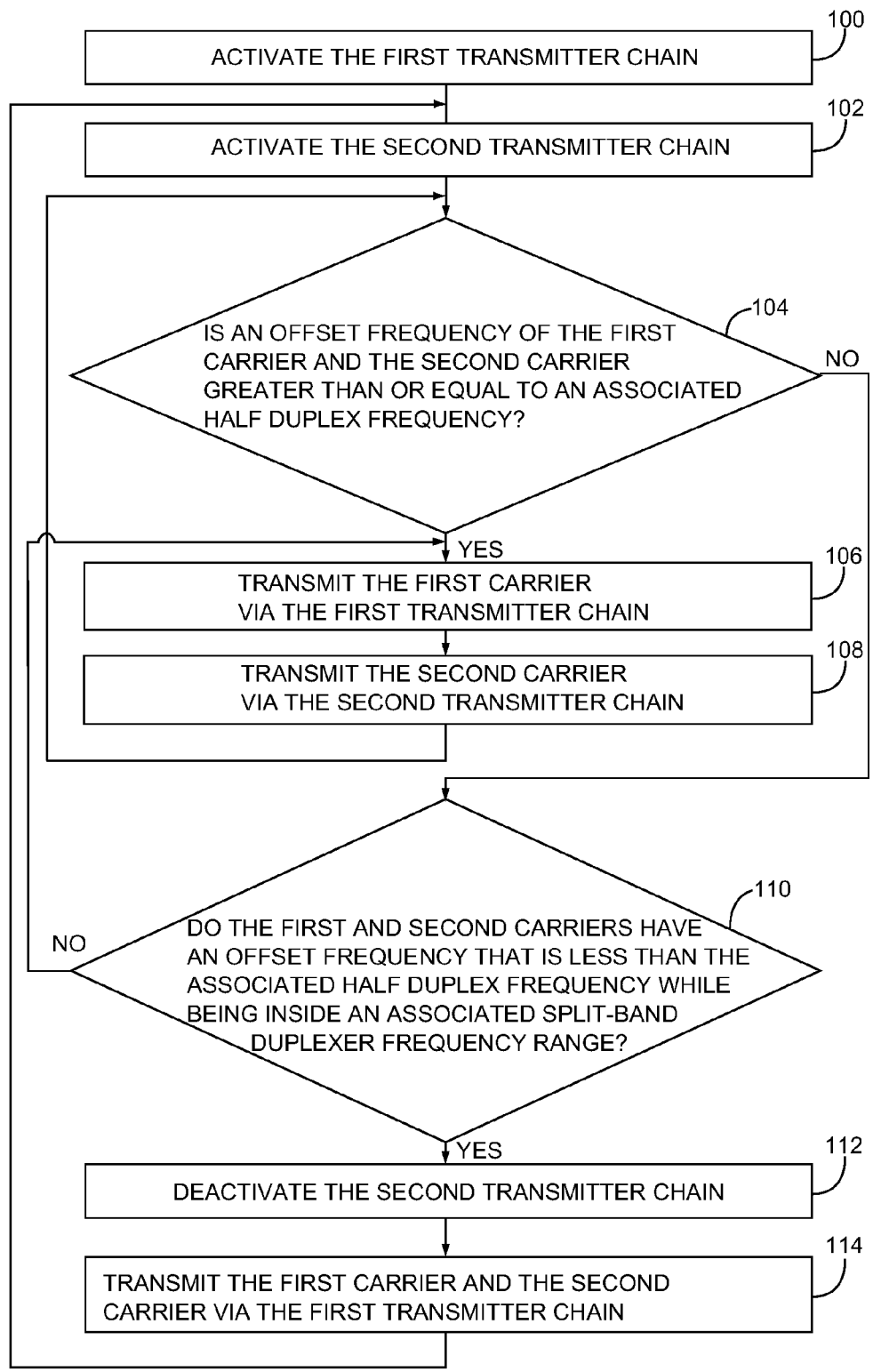
FIG. 9 is a flowchart for a method of allocating frequencies according to the present disclosure.

FIG. 9 is a process flowchart that provides a method for selecting how the first carrier C1 and the second carrier C2 are allocated between the first transmitter chain 62 (FIGS. 3, 4, 6, and 7) and the second transmitter chain 64 (FIGS. 3, 4, 6, and 7). The method begins with activating the first transmitter chain 62 (step 100). The activation of the first transmitter chain can be initiated with the CTRL3 signal output from the control system 74 (FIG. 8). A determination is made as to whether or not an offset frequency of the first carrier C1 and the second carrier C2 is greater than or equal to an associated half duplex frequency (step 104). The determination can be made automatically via the control system 74 or the baseband processor 72 (FIG. 8). If the offset frequency of the first carrier C1 and the second carrier C2 is greater than or equal to the half duplex frequency, the first carrier C1 is transmitted via the first transmitter chain 62 (step 106), and the second carrier C2 is transmitted via the second transmitter chain 64 (step 108). The control system 74 can control the transmitter block 12 (FIGS. 3, 4, 6, 7, 8) via the control signal CTRL5 and the control signal CTRL6 to generate the first carrier C1 and the second carrier C2.

However, if the offset frequency of the first carrier C1 and the second carrier C2 is not greater than or equal to the half duplex frequency a determination is made as to whether or not the first carrier C1 and the second carrier C2 have an offset frequency that is less than the associated half duplex frequency while being inside the split-band duplexer frequency range (step 110). If the determination is yes, then the second transmitter chain is deactivated (step 112), and the first carrier C1 and the second carrier C2 are transmitted via the first transmitter chain 62 (step 114). The control system 74 outputs the CTRL4 to deactivate the second transmitter chain 64.

Those skilled in the art will recognize improvements and modifications to the preferred embodiments of the present disclosure. All such improvements and modifications are considered within the scope of the concepts disclosed herein and the claims that follow.

What is claimed is:

1. A front end radio architecture (FERA) comprising:
a transmitter block having a first output terminal and a second output terminal;
a power amplifier (PA) having a first input terminal coupled to the first output terminal of the transmitter block, a second input terminal coupled to the second output terminal of the transmitter block, a first output terminal, and a second output terminal;
a first split-band duplexer coupled to the first output terminal of the PA; and
a second split-band duplexer coupled to the second output terminal of the PA, wherein the first split-band duplexer is active with a first carrier and the second split-band duplexer is active with a second carrier when the first carrier and the second carrier have an offset frequency equal to or greater than an associated half duplex frequency.

2. The FERA of claim 1, wherein the transmitter block comprises:
a first transmitter;
a first radio frequency (RF) phase locked loop (PLL);

a first RF modulator coupled to the first transmitter and the first RF PLL;
a second transmitter;
a second RF PLL;
a second RF modulator coupled to the second transmitter and the second RF PLL;
and
multi-carrier combiners coupled between the first RF modulator and the second RF modulator.

3. The FERA of claim 1, wherein the PA includes a first amplifier cell coupled between the first input terminal and the first output terminal of the PA, and a second amplifier cell coupled between the second input terminal and the second output terminal of the PA.

4. The FERA of claim 1, wherein only one of the first split-band duplexer or the second split-band duplexer is active when the first carrier and the second carrier have an offset frequency that is less than an associated half duplex frequency, and wherein the first carrier and the second carrier are within an associated split-band duplexer frequency range.

5. The FERA of claim 1, wherein the first split-band duplexer includes only TX filters and the second split-band duplexer only includes RX filters.

6. A mobile terminal comprising:
a first antenna;
a second antenna;
a front end radio architecture (FERA) comprising:
 a transmitter block having a first output terminal and a second output terminal;
 a power amplifier (PA) having a first input terminal coupled to the first output terminal of the transmitter block, a second input terminal coupled to the second output terminal of the transmitter block, a first output terminal, and a second output terminal, the PA comprising;
  a first amplifier cell;
  a second amplifier cell; and
 a first duplexer coupled between the first output terminal of the PA and the first antenna;
 a second duplexer coupled between the second output terminal of the PA and the second antenna, and
 a control system having outputs for activating and deactivating the first amplifier cell and the second amplifier cell, wherein when a first carrier and a second carrier have an offset frequency equal to or greater than an associated half duplex frequency, a first transmitter chain made up of the first amplifier cell and the first duplexer is active to transmit the first carrier, and a second transmitter chain made up of the second amplifier cell and the second duplexer is active to transmit the second carrier.

7. The mobile terminal of claim 6, wherein the transmitter block comprises:
a first transmitter;
a first radio frequency (RF) phase locked loop (PLL);
a first RF modulator coupled to the first transmitter and the first RF PLL;
a second transmitter;
a second RF PLL;
a second RF modulator coupled to the second transmitter and the second RF PLL; and
multi-carrier combiners coupled between the first RF modulator and the second RF modulator.

8. The mobile terminal of claim 6, wherein the first duplexer and the second duplexer are split-band duplexers.

9. The mobile terminal of claim 8, wherein only one of the first transmitter chain made up of the first amplifier cell and the first duplexer or the second transmitter chain made up of the second amplifier cell and the second duplexer is active to transmit the first carrier and the second carrier when the first carrier and the second carrier have an offset frequency that is less than an associated half duplex frequency, and wherein the first carrier and the second carrier are within an associated split-band duplexer frequency range.

10. The mobile terminal of claim 8, wherein the first duplexer includes only TX filters and the second duplexer includes only RX filters to improve isolation between the first antenna and the second antenna.

11. A front end radio architecture (FERA) comprising:
a power amplifier (PA) comprising:
 a first input terminal;
 a second input terminal;
 a first output terminal;
 a second output terminal;
 a first amplifier cell coupled between the first input terminal and the first output terminal, wherein the first amplifier cell is responsive to an activating and deactivating first control signal; and
 a second amplifier cell coupled between the second input terminal and the second output terminal wherein the second amplifier cell is responsive to an activating and deactivating second control signal;
a first duplexer coupled to the first output terminal; and
a second duplexer coupled to the second output terminal, wherein when a first carrier and a second carrier have an offset frequency equal to or greater than an associated half duplex frequency, a first transmitter chain made up of the first amplifier cell and the first duplexer is active to transmit the first carrier, and a second transmitter chain made up of the second amplifier cell and the second duplexer is active to transmit the second carrier.

12. The FERA of claim 11, further including a transmitter block comprising:
a first transmitter;
a first radio frequency (RF) phase locked loop (PLL);
a first RF modulator coupled to the first transmitter and the first RF PLL;
a second transmitter;
a second RF PLL;
a second RF modulator coupled to the second transmitter and the second RF PLL; and
multi-carrier combiners coupled between the first RF modulator and the second RF modulator.

13. The FERA of claim 11, wherein the first duplexer and the second duplexer are split-band duplexers.

14. The FERA of claim 13, wherein only one of the first transmitter chain made up of the first amplifier cell and the first duplexer or the second transmitter chain made up of the second amplifier cell and the second duplexer is active to transmit the first carrier and the second carrier when the first carrier and the second carrier have an offset frequency that is less than an associated half duplex frequency, and wherein the first carrier and the second carrier are within an associated split-band duplexer frequency range.

15. The FERA of claim 13, wherein the first duplexer includes only TX filters and the second duplexer only includes RX filters.

* * * * *